(12) United States Patent
Toleno et al.

(10) Patent No.: US 10,888,037 B1
(45) Date of Patent: Jan. 5, 2021

(54) ANTI-FOGGING HMD UTILIZING DEVICE WASTE HEAT

(71) Applicant: MICROSOFT TECHNOLOGY LICENSING, LLC, Redmond, WA (US)

(72) Inventors: Brian Joseph Toleno, Cupertino, CA (US); Gavin D. Stanley, Puyallup, WA (US); Douglas Lea Heirich, Palo Alto, CA (US); Tzu-Yuan Lin, San Jose, CA (US); Sridhar Canumalla, Sammamish, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 16/579,013

(22) Filed: Sep. 23, 2019

(51) Int. Cl.
| | | |
|---|---|---|
| *G06F 3/01* | (2006.01) | |
| *H05K 7/20* | (2006.01) | |
| *G05D 23/19* | (2006.01) | |
| *G02B 27/01* | (2006.01) | |

(52) U.S. Cl.
CPC ..... *H05K 7/20963* (2013.01); *G02B 27/0176* (2013.01); *G05D 23/19* (2013.01); *G06F 3/011* (2013.01)

(58) Field of Classification Search
CPC .......... H05K 7/20963; G02B 27/0176; G05D 23/19; G06F 3/011
See application file for complete search history.

(56) References Cited

U.S. PATENT DOCUMENTS

| | | | |
|---|---|---|---|
| 5,471,036 A | 11/1995 | Sperbeck | |
| 2009/0231687 A1* | 9/2009 | Yamamoto | G02B 27/017 359/359 |
| 2016/0055822 A1* | 2/2016 | Bell | G09G 5/10 345/207 |
| 2016/0212879 A1* | 7/2016 | Nikkhoo | H05K 7/2039 |
| 2017/0168303 A1* | 6/2017 | Petrov | G02B 27/0176 |
| 2017/0184863 A1 | 6/2017 | Balachandreswaran et al. | |
| 2018/0196485 A1* | 7/2018 | Cheng | G02B 27/0176 |
| 2018/0376626 A1 | 12/2018 | Hurbi et al. | |
| 2019/0377191 A1* | 12/2019 | Hughes | G06K 9/00617 |
| 2020/0103642 A1* | 4/2020 | Hirowatari | G02B 25/001 |

OTHER PUBLICATIONS

"International Search Report and Written Opinion Issued in PCT Application No. PCT/US20/037980", dated Sep. 28, 2020, 11 Pages.

* cited by examiner

*Primary Examiner* — Carolyn R Edwards
(74) *Attorney, Agent, or Firm* — Workman Nydegger (57) ABSTRACT

A system for increasing the temperature of a display element includes a heat source configured to perform a user experience function independent of generating heat. The system also includes a thermally conductive element that is coupled to the heat source and is positioned proximate to the display element, forming a thermally conductive path between the heat source and the display element. A method for increasing the temperature of a display element includes generating heat by operating a heat source to perform a user experience function independent of generating heat, and dispersing the heat from the heat source to the display element via a thermally conductive path formed by a thermally conductive element coupled to the heat source and positioned proximate to the display element.

20 Claims, 9 Drawing Sheets

ANTI-FOGGING HMD UTILIZING DEVICE WASTE HEAT

BACKGROUND

Airborne water molecules condense onto a surface at the applicable dew point temperature. A dew point temperature depends on the temperature of the surface, the temperature and relative humidity of the surrounding ambient air. For condensation to occur, the surface temperature must be sufficiently lower than the temperature of the air, and the required difference between the air temperature and the surface temperature is negatively associated with the relative humidity of the environment. Dew point indexes represent the relationships between relative humidity, ambient temperature, and surface temperature that give rise to dew points for condensation. Condensation is commonly associated with outdoor environments, humid environments, and transitioning from a cold environment to a warm environment (or from a warm environment to a cold environment with sufficient relative humidity).

Condensation often gives rise to a number of problems, particularly in the context of head-mounted optics, such as glasses, goggles, or optics associated with head-mounted displays (e.g., mixed reality head-mounted displays). Moisture that has condensed on a head-mounted optic increases the apparent opacity of the head-mounted optic (e.g., the optic "fogs"), affecting visibility at and/or through the optic and degrading the user's experience with the head-mounted optic. The foregoing can be particularly problematic for VR (Virtual Reality) type devices that provide optical displays that are completely enclosed and/or that bias against a user's face during use to seal out ambient light.

Some existing solutions for eliminating and/or reducing condensation on head-mounted optics may include utilizing hydrophilic coatings to allow condensed water molecules to wet out along the surface of the optic so as not to form view-obstructing droplets. Other existing solutions include the use of electrical resistance heating wires that are built into or around the optic to increase the temperature of the optic by causing electrical current to pass through the resistance heating wires. Such solutions, however, fall short in a number of scenarios, such as where the head-mounted optic utilizes coatings that are not compatible with a hydrophilic coating, or where electrical resistance heating wires would undesirably increase battery consumption, weight, and/or hardware requirements.

Accordingly, there exists a great need in the art to address the problem of condensation on head-mounted optics, particularly for Mixed Reality HMD (Head Mounted Devices/Displays). It will be appreciated that the term Mixed Reality refers to two different types of technology, including AR (Augmented Reality), which typically refers to virtual experiences where virtual objects are visually placed within the real world, such that a user experiences virtual content and the real world simultaneously, as well as VR (Virtual Reality), which includes immersive virtual experiences where a user's view of the real-world is completely obscured and only virtual objects are perceived. Typically, "mixed reality" refers to either augmented reality or virtual reality environments. However, for the sake of clarity and simplicity, the terms mixed reality, virtual reality, and augmented reality are sometimes used interchangeably herein.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

In some embodiments, a system for increasing the temperature of a display element, such as an HMD display (e.g., a head-mounted optic) includes a heat source configured to perform a user experience function independent of generating heat (e.g., the heat source only generates heat as a byproduct of performing an independent function). The system also includes a thermally conductive element that is coupled to the heat source and is positioned proximate to the display element, thereby forming a thermally conductive path between the heat source and the display element.

The display element takes on various forms in different embodiments. Such forms may include a head-mounted display (HMD), an optically transmissive element, and/or an element that completely obscures view of a real-world environment (when worn by a user).

Similarly, the heat source takes on various forms in different embodiments. Such forms may include a central processing unit (CPU), a graphics processing unit (GPU), a light source, and/or a display engine (e.g., for rendering or generating images for display on the display element).

At least some embodiments are directed to implementations in which the thermally conductive element is optically transmissive, and in some instances, the system further includes a switch that selectively connects and disconnects the heat path between the heat source and the display element (e.g., in response to detecting a triggering event).

In some embodiments, the system further includes a sensor (or more than one sensor) for detecting one or more temperatures and/or a relative humidity associated with the display element or an ambient environment in which the system is located.

Disclosed embodiments include methods for selectively increasing the temperature of a display element by using heat byproducts from one or more hardware devices of a HMD. Disclosed methods include, for example, a system generating heat by operating a heat source to perform a user experience function (e.g., a CPU, GPU, display engine and/or other function) independent of generating heat. In such instances, the heat is a byproduct of the primary user experience function performed by hardware of a HMD. The method further includes dispersing the heat from the heat source to the display element via a thermally conductive path formed by a thermally conductive element coupled to the heat source and positioned proximate to the display element. In some embodiments, disclosed methods further include detecting a triggering event and, in response to detecting the triggering event, selectively disconnecting the thermally conductive path and/or selectively disabling a heat source (such as a redundant hardware component) in the HMD and so as to stop dispersing heat to/through the thermally conductive element and display element.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

A dew point is reached when the temperature of a surface is sufficiently lower than the temperature of the surrounding air, and the appropriate level of relative humidity is present. Water molecules in the surrounding air condense onto the surface at the dew point. When water molecules condense onto a surface used as a display element (e.g., glasses, goggles, head-mounted displays (HMDs) or other display optics), the visibility at or through the display optic is reduced, which hinders the user's experience with the display element (e.g., their ability to see at or through the display element is reduced). Reduced visibility can become a safety issue, for example, for first responders, emergency personnel, or other users utilizing a display element in a hazardous and/or industrial environment.

Conventional solutions for eliminating and/or reducing condensation on head-mounted optics include utilizing hydrophilic coatings to allow condensed water molecules to wet out along the surface of the display element so as not to form view-obstructing droplets. Because, often, increasing the temperature of a surface reduces the incidence of condensation onto the surface, other prior solutions have included implementing electrical resistance heating wires into/around the optic to increase the temperature of the optic to prevent/reduce condensation (e.g., similar to the heating elements commonly found on rear windshields of vehicles).

Conventional solutions, however, cannot be used in every scenario where condensation might occur on a display element. For example, conventional solutions using hydrophilic coatings fail when the display element relies on coatings that are not compatible with such coatings. Conventional solutions using electrical resistance heating wires would require additional hardware, power consumption, and weight, which is undesirable, for example, in display elements implemented as part of a head-mounted, mixed-reality display.

This disclosure includes embodiments that may address some or all of the aforementioned challenges with addressing condensation on display elements/optics. In some embodiments, a system for increasing the temperature of a display element includes a heat source that is configured to perform a primary user experience function independent of generating heat. Put differently, the heat source generates heat only as a byproduct of performing a primary function independent of generating heat. Such primary functions may include, for example, CPU functions, GPU functions, display engine functions, lighting functions and/or other primary functions other than just generating heat.

The system also includes, in some embodiments, a thermally conductive element that is coupled to the heat source, which is positioned proximate to the display element (e.g., in direct thermal conductive contact or at least in very close proximity to transmit heat through thermal radiance). The thermally conductive element forms a thermally conductive path between the heat source and the display element.

Those skilled in the art will recognize that the embodiments disclosed herein may provide significant benefits over conventional systems and methods for reducing condensation on display elements. When at least some of the embodiments disclosed herein are implemented, the waste heat from the heat source is used (or redirected) to the display element, which operates to increase the temperature of the display element. Even a small increase in surface temperature can, in some instances, reduce the incidence of condensation onto the surface.

Furthermore, diffusing/dispersing waste heat from a heat source into the environment can be counterproductive, in particular because the waste heat then increases the temperature of the ambient environment surrounding the display element, which can thereby exacerbate the difference between the environment temperature and the surface temperature, causing increased condensation. In at least some disclosed embodiments, counterproductive dispersion of waste heat into the ambient environment is avoided by redirecting the waste heat toward/into the display element and to prevent condensation on the display element.

At least some disclosed embodiments allow for a more efficient system that utilizes 'waste' heat that is generated as a byproduct from a hardware component in a HMD, such as a CPU, GPU or other display component having a primary function associated with processing data or rendering images, to increase the temperature of the display element to prevent/reduce condensation onto the display element (and without requiring the passage of current through electrical resistance wires). By omitting the need for independently powered electrical resistance wires and/or other dedicated heating systems, disclosed embodiments allow for a display element having a specialized heat distribution and anti-fogging system that utilizes waste heat and that can avoid the excess hardware, battery power consumption, and/or weight that would otherwise attend the use of an electrical resistance wire heating systems.

Having just described some of the various high-level features and benefits of the disclosed embodiments, attention will now be directed to FIGS. 1 through 6. These figures illustrate various functionalities, examples, supporting illustrations, and methods related to systems for selectively increasing the temperature of a display element (e.g., anti-fogging systems that utilize waste heat).

Figure 1:
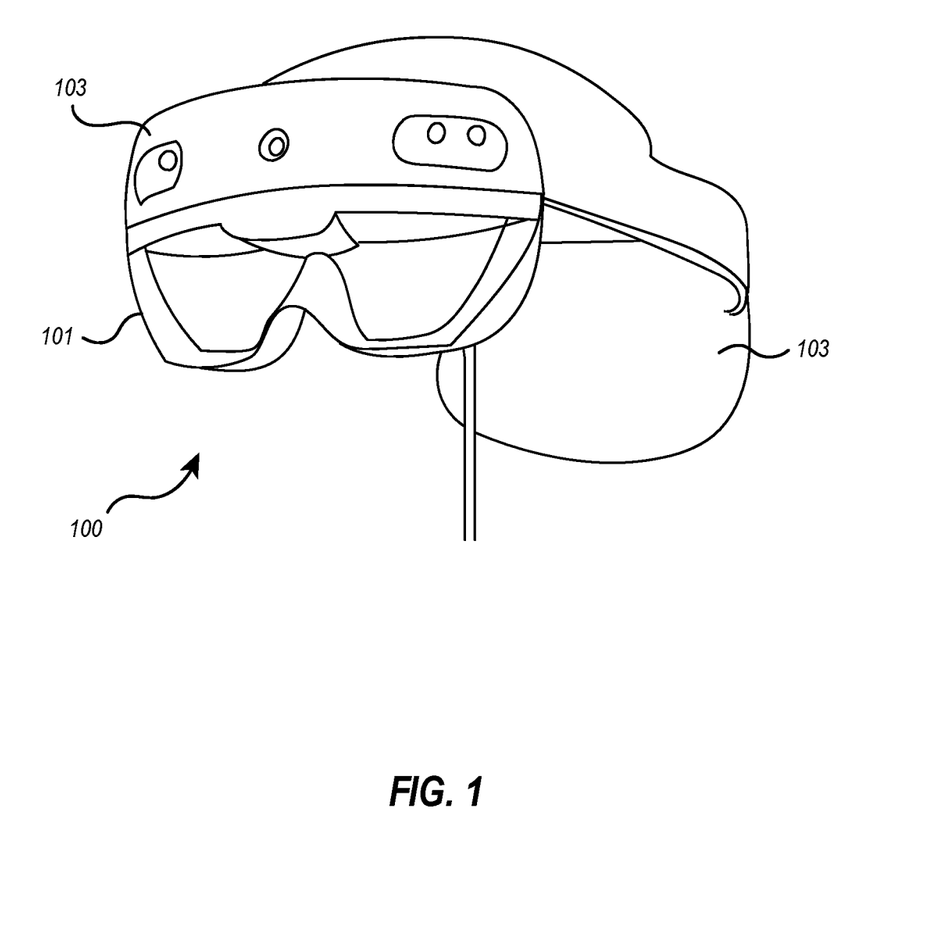
FIG. 1 illustrates an example of a HMD having a head-mounted optic in which at least some disclosed embodiments may be implemented.

FIG. 1 illustrates an example of a mixed-reality head-mounted display (HMD) 100 in which at least some disclosed embodiments may be implemented. The HMD 100 includes one or more display elements 101 (e.g., for displaying virtual content in conjunction with a real-world environment to a user, or for displaying virtual content without also displaying a real-world environment to a user) and other hardware 103 for facilitating the intended functionality of the HMD. Although not specifically shown, the other hardware can include components such as head/hand/eye tracking cameras/systems, surface reconstruction systems, display engines for generating/rendering virtual images, CPU(s), GPU(s), HPU(s), hardware storage devices, batteries, communication systems, other sensors, etc.). These hardware components can be distributed throughout the HMD.

As the elements of hardware 103 of HMD 100 perform their respective user experience functions, they generate heat. In conventional systems, this heat is dispersed into the environment as waste heat. In contrast, disclosed embodiments harness and utilize this heat to increase the temperature of one or more display elements 101 associated with HMD 100.

Many of the embodiments disclosed herein are discussed in the context of a mixed-reality HMD as shown in FIG. 1. However, those skilled in the art will recognize that the principles disclosed herein are applicable to any display optic/element (e.g., eyeglasses, goggles, windows, helmets, windshields, mirrors, screens, other head-mounted displays/optics, etc.), so long as there is a nearby heat source that generates heat (e.g., waste heat) as a byproduct of performing some other primary function (e.g., a user experience function such as processing data, rendering images, storing data, storing power in a battery, etc.) independent of generating heat. A thermally conductive element can be coupled to the heat source and placed proximate to the display optic/element to transfer heat from the heat source to the display optic/element (thereby increasing the temperature of the display optic/element).

Figure 2A:
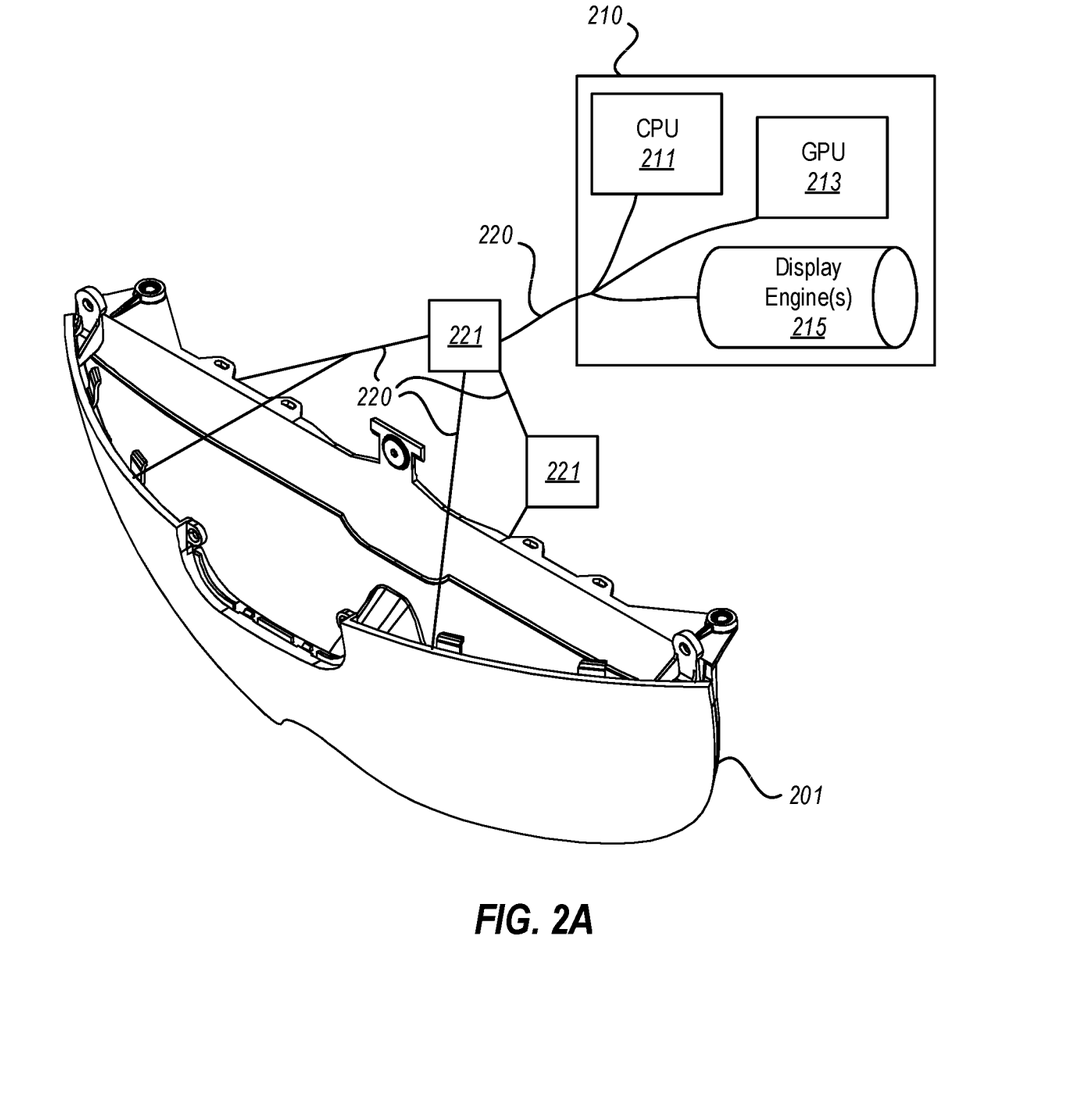
FIGS. 2A-2C illustrate conceptual representations of one or more heat sources, display elements, and thermally conductive elements.
Figure 2B:
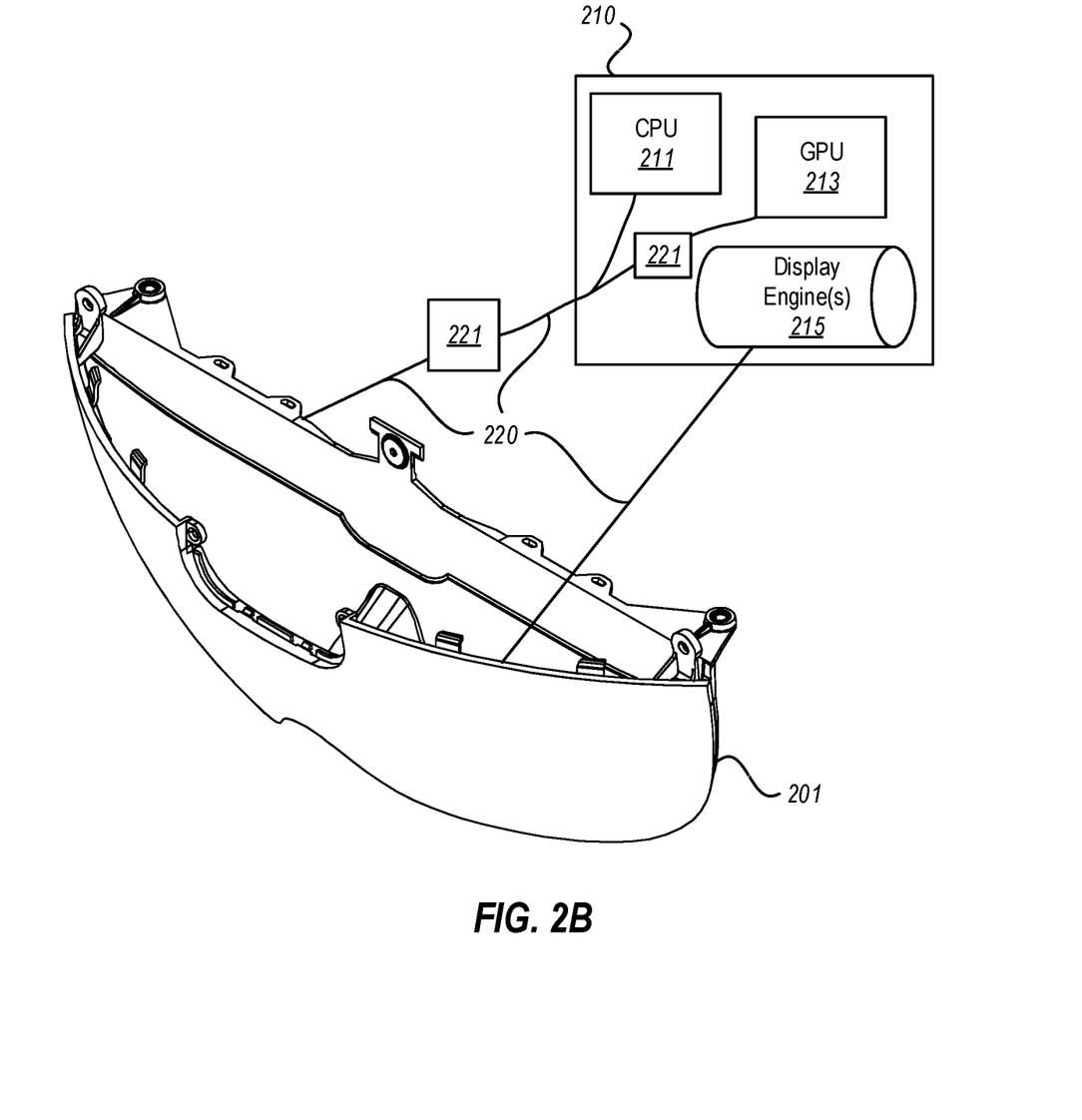
Figure 2C:
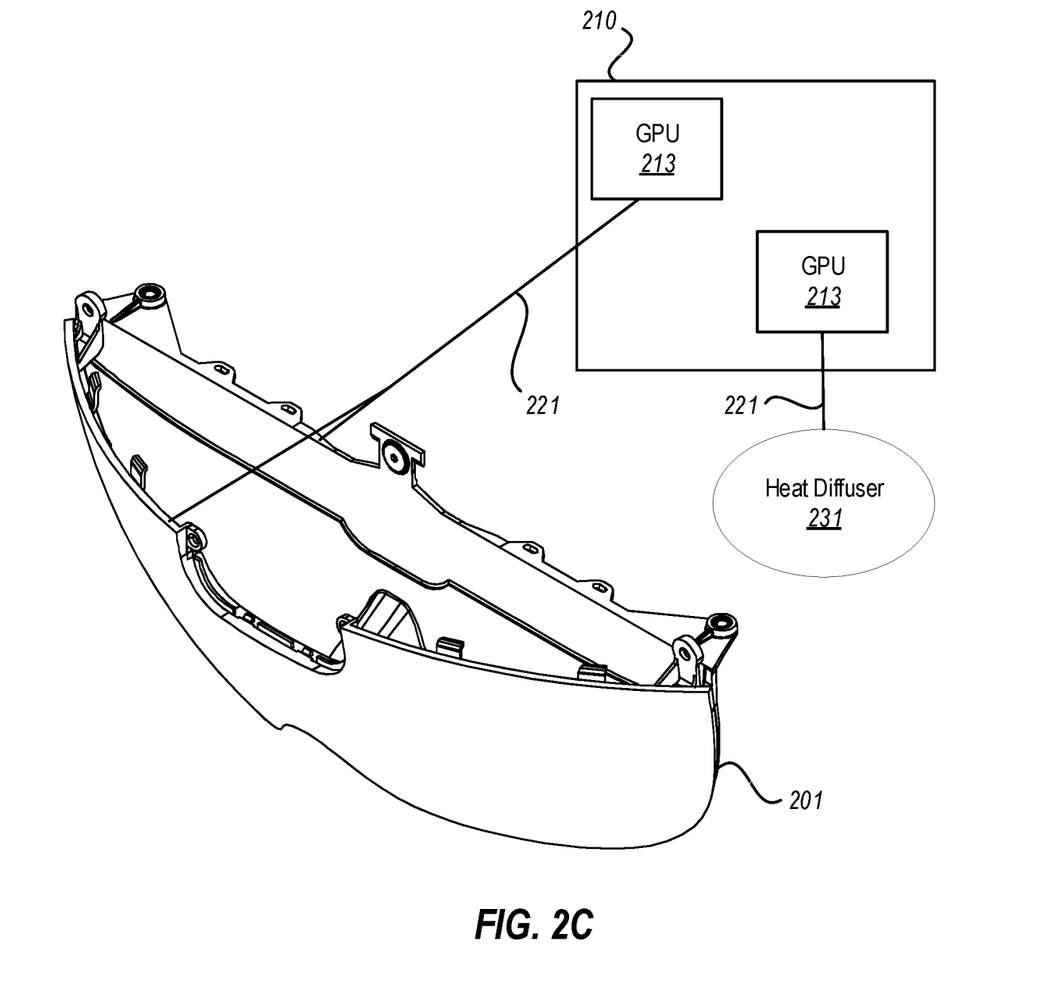

FIGS. 2A-2C illustrate conceptual representations of one or more heat sources 210, display elements 201, and thermally conductive elements 220. In the embodiment depicted in FIG. 2A, the heat sources 210 include a central processing unit (CPU) 211, a graphics processing unit (GPU) 213, and display engine(s) 215. Furthermore, as shown in FIG. 2A, the display elements 201 are represented as a visor assembly (such as a visor assembly represented as part of the display elements 101 of the HMD 100 represented in FIG. 1). The heat sources 210 can be implemented, for example, into a HMD that is also associated with the display elements 201, such that both the heat sources 210 and the display elements 201 are part of the same HMD.

The display elements 201 are configured, in some instances, to display virtual content (e.g., virtual content generated/rendered by display engine(s) 215) while also transmitting light from a user's real-world environment for perception by the user (i.e., the display elements may comprise lenses that are optically transmissive and mounted on a HMD). It will be appreciated, however, that the display elements of the present disclosure are not limited to such implementations. For example, display elements could also include a relatively opaque screen (which may include a transparent screen and an opaque surface behind the screen) of a HMD for displaying virtual content to a user that does not transmit light from the user's real-world environment (e.g., a VR HMD).

It should be noted that at least some of the presently disclosed embodiments are particularly beneficial when implemented into display elements of VR HMDs, which can be especially susceptible to condensation because they are typically configured to enclose the user's field-of-view (e.g., with gaskets) to completely obscure the user's view of their real-world environment (thereby increasing the relative humidity and temperature of the air surrounding the display elements based on heat and/or sweat generated by the user's body).

As noted above, other display elements are within the scope of this disclosure, such as safety goggles, windows, large-format display screens, eyeglasses, windshields, mirrors, etc.

Each of the heat sources 210 of FIG. 2A performs a user experience function independent of generating heat. For example, the CPU 211 may execute instructions for carrying out tasks/acts/objectives for facilitating a user experience with the HMD of which CPU 211 is a part. The GPU 213 may perform operations to process/render graphics, images, animations, and/or virtual objects for display on the display elements 201. The display engine(s) 215 may include one or more light sources (e.g., light emitting diodes (LEDs), laser diodes) for emitting light to display the graphics rendered by the GPU 215 on the display elements 201. Additional aspects of other computer hardware elements that can operate as heat sources within the scope of this disclosure are discussed later on.

In other embodiments, heat sources take the form of batteries, hardware elements of communications systems, sources of light (e.g., lights for illuminating the real-world environment of a user), and/or any other component that generates heat as a byproduct (e.g., waste heat) as a result of performing some other function (e.g., a primary function, such as a CPU, GPU, display engine, battery, storage and/or other function) independent of generating heat.

FIG. 2A also includes representations of one or more thermally conductive elements 220. As shown, the thermally conductive elements 220 are coupled to the heat sources 210. In particular, the thermally conductive elements 220 are shown as being connected to the CPU 211, the GPU 213, and the display engine(s) 215. It should be noted, however, that the thermally conductive elements 220 need not be connected/coupled to each and every heat source available to generate heat as a byproduct for heating display elements.

Because the thermally conductive elements 220 are connected to (and therefore in thermal communication with) one or more heat sources 210, waste heat generated by the heat sources 210 transfers into and along the thermally conductive elements. Thus, the waste heat generated by the heat sources 210 may be utilized by the system, rather than being dispersed into the surrounding environment.

The thermally conductive elements are shown as lines/wires. These conductive elements do not, however, have to be wires. For instance, they can be flat strips of conductive material, tubes, heat sinks, and/or any other thermal element that is capable of transferring heat. In some instances, multiple thermally conductive elements 220 connect/extend from a single hardware component that is capable of generating heat as a byproduct of another function. In some instances, a single heat sink is used to thermally connect multiple different hardware components together and that heat sink comprises at least a part of the thermally conductive elements 220.

FIG. 2A also illustrates thermally conductive elements 220 as being positioned proximate to the display elements 201 at various points. At a minimum, at least a part of the thermally conductive elements 220 is in direct contact with the display elements 201 and/or in close proximity to the display elements 220 (e.g., close enough proximity so as to permit heat from the thermally conductive elements 220 to be transmitted to the display elements 201).

In FIG. 2A, the thermally conductive elements 220 are conceptually represented as being in contact with the display elements 201. It will be appreciated, however, that other configurations are within the scope of this disclosure. For example, the thermally conductive elements may be spatially offset from display elements, while still allowing heat radiating from the thermally conductive elements to increase the temperature of the display elements due to their close proximity. Accordingly, with regard to the foregoing, it will be appreciated that films, coatings, layers, or other physical objects may be interposed between the thermally conductive elements and the display elements, and yet still allow heat to be transferred from the thermally conductive elements to the display elements, through conduction and/or radiation. Such thermally reactive elements may still be considered positioned proximate to or adjacent to the display elements if they can transfer heat to the display elements through direct thermal conduction and/or thermal radiation.

In some instances, the thermally conductive elements are not spatially offset from the display elements (i.e., the thermally conductive elements are in direct physical contact with the display elements). In still other elements, the thermally conductive elements are integrally formed with the display elements (e.g., the thermally conductive elements are interstitially positioned within the display elements).

The thermally conductive elements 220 may extend to be positioned proximate to some or all parts of a single or multiple display elements. Various exemplary configurations of thermally conductive elements and positionings of thermally conductive elements with respect to display elements are discussed in more detail with reference to FIGS. 4A-4H.

When the thermally conductive elements 220 are coupled to the heat source(s) 210 and positioned proximate to the display elements 201, the thermally conductive elements 220 form a thermally conductive path between the heat sources (210) and the display elements (201), allowing for waste heat to transfer from the heat source(s) 210 to the display elements (201).

In some situations, providing additional heat to the display elements to increase the temperature of the display elements (to prevent condensation) can result in discomfort to the user. For example, when a user utilizes a HMD or other head-mounted display elements/optics in a hot real-world environment, providing additional heat to the display elements may increase an already uncomfortably high temperature of the air surrounding the eyes and/or face of the user. Accordingly, it is useful, in some instances, to provide a way to selectively connect and disconnect the thermally conductive paths between the heat sources and the display elements, such that waste heat from the heat sources is not always transferred to the display elements.

FIG. 2A also shows one or more switches 221 along the thermally conductive path formed by the thermally conductive elements 220. In some instances, the switch(es) 221 are embodied as one or more electromechanical switches. In other instances, the switch(es) 221 are implemented as one or more piezoelectric switches.

In some embodiments, the switch(es) 221 are operable to selectively connect and disconnect the heat path between the heat source(s) 210 and the display element(s) 201 in response to a triggering event, such as by making and/or breaking direct contact between two different thermally conductive materials (e.g., wires or other conductive elements). The triggering events will be discussed in more detail hereinbelow with reference to FIGS. 3A and 3B.

In the embodiment shown in FIG. 2A, various thermally conductive elements 220 are coupled to each of the heat sources 210, and each thermally conductive element extending from each of the heat sources (i.e., the CPU 211, the GPU 213, and the display engine(s) 215) converges at the first of the switches 221 (i.e., the switch shown positioned closed to heat sources 210). After the thermally conductive elements 220 converge to a common path/location toward the display elements (e.g., at the first switch), the thermally conductive paths are shown to diverge the display elements 201. Some of the paths lead to various locations on the various parts of the display elements 201. One path leads toward the second of the switches 221 and then continues toward a distinct part of the display elements 201.

In the embodiment shown in FIG. 2B, only the thermally conductive elements 220 extending from the CPU 211 and the GPU 213 converge to a common point before extending to a portion of the display elements. The thermally conductive path between the GPU 213 and the common point includes a switch 221, such that waste heat from the GPU 213 is selectively combinable with the waste heat from the CPU 211 for transfer to the display elements. Another switch 221 is shown between the common point and the display elements, such that the waste heat from the CPU 211 (or the combined waste heat of the CPU 211 and the GPU 213 if the first of the switches 221 is in a connected mode) is selectively transferable to the display elements. As such, the switches 221 between the CPU 211, the GPU 213, and the display elements are operable to selectively allow waste heat from the CPU 211 and/or the GPU 213 to be transferred to the display elements. In some instances, the switches are put in (or persist) in a disconnected mode when the display elements are used in a hot environment (as further discussed with reference to FIGS. 3A and 3B). It will be appreciated that any combination of switches may be used at one or more different portions of the conductive elements 220 to facilitate the selective thermal transmission of waste heat from one or more hardware components to the display elements.

The embodiment shown in FIG. 2B also illustrates another embodiment, in which a thermally conductive element 220 extends from a display engine(s) 215 toward the display elements 201. As illustrated, the thermally conductive path between the display engine and the display elements does not include a switch. Accordingly, waste heat from the display engine(s) 215 is not selectively transferred from the display engine(s) 215 via the thermally conductive element 220 toward the display elements 201. Rather, waste heat from the display engine(s) 215 is always transferred to the display elements 201 via the thermally conductive element 220 extending between the display engine(s) 215 and the display elements 201.

Therefore, based on the embodiments shown and described with reference to FIGS. 2A and 2B, those skilled in the art will recognize that any number and/or combination of switches can be interspersed throughout the thermally conductive paths formed by the thermally conductive elements in order to allow for selective disconnection of the thermally conductive path at any point and/or portion of the thermally conductive path for one or more of the different HMD components. Likewise, in some embodiments, one or more components may be continuously connected in thermal conductivity to help disperse waste heat from the HMD component towards the display element(s). Alternatively, in some embodiments, where distinct thermally conductive paths exist between each heat source and the display elements, a switch may be utilized along each distinct thermally conductive path to selectively disconnect the corresponding thermally conductive path so as to prevent heat from reaching the display elements along the corresponding path.

Also, based on the embodiments shown and described in FIGS. 2A and 2B, those skilled in the art will understand that numerous configurations, formations, and/or paths for thermally conductive elements between the heat sources and the display elements are within the scope of this disclosure. In an example embodiment, for instance, each heat source includes a single thermally conductive element coupled thereto, with each thermally conductive element extending toward to a different position proximate to the display elements without converging, and without any switches along any of the heat paths. In another example, the thermally conductive element(s) extending from each heat source converge to a common nexus, without a switch, and then branch out toward various portions of the display elements with switches existing along the thermally conductive paths after the branching out. In yet another example, only a single heat source is used, with a thermally conductive element that extends from the heat source as a single path but branches out into a plurality of paths before or upon reaching the display elements. In still another example, a single heat source can have multiple thermally conductive elements coupled thereto. Furthermore, thermally conductive elements extending from one or more heat sources may include switches along their heat paths before reaching a common nexus with other thermally conductive elements.

Some embodiments of the present disclosure utilize different mechanisms for selectively transferring waste heat from one or more heat sources toward display elements. For example, the heat sources 210 shown in FIG. 2C include multiple GPUs 213. In some embodiments, the multiple GPUs 213 operate as redundant heat sources and have the same functionality (e.g., performing operations to process/render graphics, images, animations, and/or virtual objects for display on display elements). Furthermore, in some instances, the GPUs 213 are configured to be selectively enabled or disabled in response to a triggering event (as noted above, triggering events are discussed in more detail with reference to FIGS. 3A and 3B).

In the embodiment shown in FIG. 2C, one GPU of the GPUs 213 is in thermal communication (shown by a thermally conductive element 220) with a heat diffuser 231, whereas the other GPU of the GPUs 213 is in thermal communication with the display elements 201, shown by the thermally conductive path formed by another set of thermally conductive elements 221. Thus, when the GPU connected with the heat diffuser 231 is selectively enabled, while the other GPU is selectively disabled, no waste heat is transferred to the display elements 201, which may be desirable, for example, when the difference between the temperature of the display elements 201 and the temperature of the surrounding environment is small. On the other hand, when the GPU connected with the display elements 201 is selectively enabled, while the other GPU is selectively disabled or also selectively enabled, waste heat is transferred to the display elements. In this regard, including heat sources that may be selectively enabled or disabled may allow for selectively transferring waste heat to the display elements, rather than constantly transferring heat to the display elements. It will be appreciated that any combination of switches and/or selectively enablable heat sources may be utilized for selectively allowing heat flow from the heat sources to one or more display elements.

Although the thermally conductive elements are described above as being coupled and/or connected to the heat sources, it should be noted that the thermally conductive elements may, in some instances, also be positioned proximate to the heat sources in order to allow for heat transfer from the heat sources to the thermally conductive elements.

As noted above, selectively connecting or disconnecting switches associated with thermally conductive paths and/or selectively enabling or disabling heat sources may be performed in response to a triggering event. In some instances, a triggering event is detecting one or more temperatures and/or a relative humidity that exceed a predetermined threshold, based on temperature/humidity conditions detected by one or more sensors on the HMD and/or one or more remote sensors that are in communication (e.g., wirelessly) with the HMD.

Figure 3A:
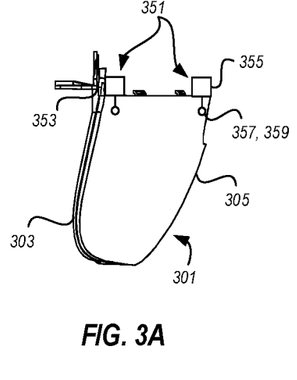
FIGS. 3A and 3B illustrate conceptual representations of temperature and/or relative humidity sensors on a display element.
Figure 3B:
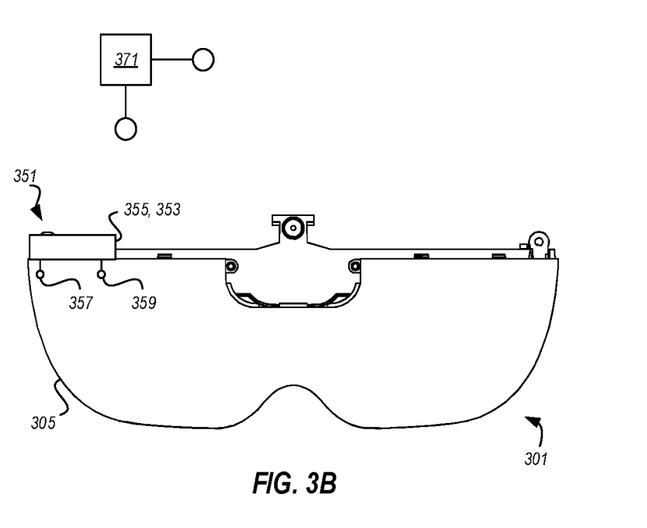

FIGS. 3A and 3B illustrate conceptual representations of sensors 351 associated with a waste heat transfer system for increasing the temperature of display elements 301. In FIG. 3A, a pair of sensors 351 is associated with the display element 301. In particular a first sensor 353 is associated with a user-facing portion 303 of the display elements 301, and a second sensor 355 is associated with a world-facing portion 305 of the display elements 301. It should be noted, however, that embodiments of the present disclosure do not require a sensor or more than one sensor, and the multiplicity of sensors shown in FIG. 3A is demonstrated to show that any number of sensors at various positions in proximity to the display element(s) may be used in a system for increasing the temperature of display elements with waste heat from a heat source.

As shown, sensor 355 includes a first sensing element 357, and a second sensing element 359, each being positioned at or near the world-facing portion 305 of the display elements 301. For example, the first sensing element 357 may be implemented as a temperature sensing element, and the second sensing element 359 may be implemented as a relative humidity sensing element. The first sensing element 357 therefore determines a temperature reading associated with the world-facing portion 305 of the display elements 301, while the second sensing element 359 determines a relative humidity reading associated with the display elements or an environment in which the display elements are utilized.

It should be noted that the placement of the sensors and the sensing elements with respect to the display elements as shown in FIGS. 3A and 3B is illustrative only and non-limiting. For example, sensors and/or sensing elements can be placed at or near the back of a display element (e.g., toward a user) or be integrally formed with the display element(s), and, in another example, the temperature sensors may be placed at location on the display element(s) that is near a user's eye in VR implementations (e.g., within the view-obstructing elements of a VR HMD).

FIGS. 3A and 3B also show a separate sensor 371 that is not associated with the display elements. Sensor 371 is, in some instances, configured to detect one or more temperatures and/or a relative humidity associated with an environment in which the display elements are utilized. Sensor 371 may be embodied, for example, as an external thermometer associated with another portion of the HMD and/or with a completely separate temperature-sensing device or system.

Sensors 351 and/or 371 may be configured to be in communication with a logic device (which is not presently shown, but which includes a logic circuit and/or a software program stored in memory or other hardware storage of the HMD and that is executable by the HMD CPU and/or other hardware component).

Based on detected temperature and relative humidity sensor readings (e.g., a surface temperature of the relevant display element and a temperature and relative humidity of the relevant physical environment, as measured, for example, by sensors 351 and/or 371), the logic device determines whether the dew point is being approached (e.g., where the detected change in the difference between the surface temperature and the ambient temperature is increasing over time) or has been met or exceeded, according to a dew point index or table. This determination is made, in some embodiments, by determining the dew point temperature for the applicable set of conditions (e.g., the relative humidity and the temperature of the relevant physical environment) and by determining whether the surface temperature of the display element meets or exceeds a predetermined threshold associated with the dew point temperature (a threshold may be thought of as a lower bound, and the threshold may be exceeded when the value under scrutiny descends below the lower bound threshold).

The predetermined threshold associated with the dew point may be implemented as, for example, the dew point temperature itself, a temperature offset from the dewpoint temperature (e.g., a temperature that is higher than the dew point, indicating that the dew point itself is nearly met when the surface temperature exceeds the threshold), a rate of change in temperature (e.g., a change in surface or environment temperature over time, to indicate whether or not the surface temperature is approaching the dew point or whether the dew point is changing so as to approach the surface temperature), or any combination thereof (e.g., a rate of change threshold that changes based on the absolute difference between the surface temperature and the applicable dew point).

In response to determining that the predetermined threshold associated with the dewpoint is met or exceeded by the surface temperature of the display element, the logic device generates an output signal that causes one or more switches (e.g., switches 221 as demonstrated in FIGS. 2A-2B) to be connected/established with one or more thermally conductive paths (e.g., associated with thermally conductive elements 220 as described with reference to FIGS. 2A-2C) between the display elements and the heat sources to allow waste heat from the heat sources to increase the temperature of the display elements. In other embodiments, in response to determining that the predetermined threshold associated with the dewpoint is met or exceeded by the surface temperature of the display element, the logic device generates an output signal that selectively enables operation of one or more heat sources (which are hardware devices such as a GPU having a primary function other than to generate heat and which generate waste heat as a byproduct) and which are coupled to a thermally conductive element and positioned proximate to display elements (e.g., as shown in FIG. 2C) to allow waste heat from the heat sources to increase the temperature of the display elements.

In other instances, the logic device determines whether the surface temperature of the display element(s) meets or exceeds a predetermined threshold associated with user comfort. For example, in response to determining that the temperature of the display element(s) is higher than a predetermined threshold temperature associated with user comfort (e.g., 85° F.), the logic device may generate an output (or send a communication to a computing device) that causes one or more switches to disconnect/disestablish one or more thermally conductive paths between the display elements and the heat sources to prevent waste heat from the heat sources from further increasing the temperature of the display elements. Similarly, the output from the logic device may also selectively disable one or more heat sources coupled to a thermally conductive element and positioned proximate to display elements to prevent waste heat from the heat sources from further increasing the temperature of the display elements.

It should also be noted that the triggering event for causing the logic device to generate output for dispersing heat from the heat sources to the display elements and/or for refraining from dispersing heat to the display elements need not depend on sensor readings. For example, a triggering event may comprise user input entered through a mechanical button/switch and/or through an application interface for causing the waste heat from the heat sources to be transferred to the display elements (e.g., by actuating switches and/or selectively causing the triggering event and control signals to be sent for selectively enabling/disabling the certain heat sources and/or switches in the thermally conductive elements).

FIGS. 4A-4H demonstrate examples of configurations for thermally conductive elements 420 positioned proximate to display elements 401. The additional portions of the thermally conductive elements (e.g., wires, straps, tubes, heat sinks and/or other elements with the corresponding switches) that extend from the display element 401 to one or more heat sources are not shown in FIGS. 4A-4H for simplicity in illustration.

With regard to the embodiments shown in FIGS. 4A-4H, it will be appreciated that different configurations of the thermally conductive elements 420 will cause the heat from the heat sources to disperse across the display elements 401 in different ways. No particular configuration or formation for positioning the thermally conductive elements 420 proximate to the display elements 401 limits the scope of the present disclosure, and combinations of configurations or formations are within the scope of the present disclosure. FIGS. 4A-4H are presented as examples only.

Figure 4A:
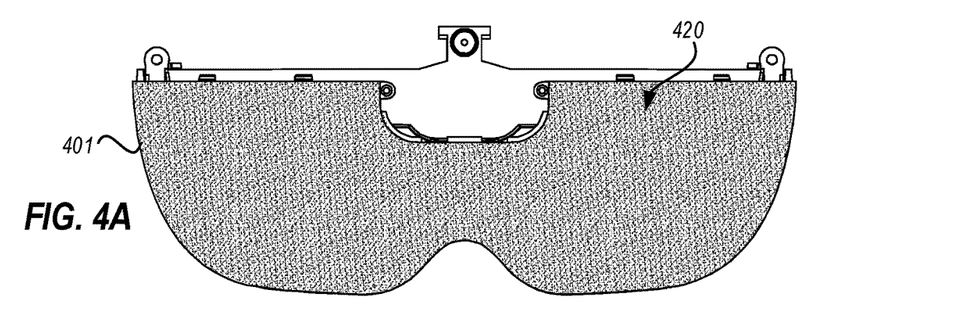
FIGS. 4A-4H demonstrate examples of configurations for thermally conductive elements positioned proximate to display elements.
Figure 4B:
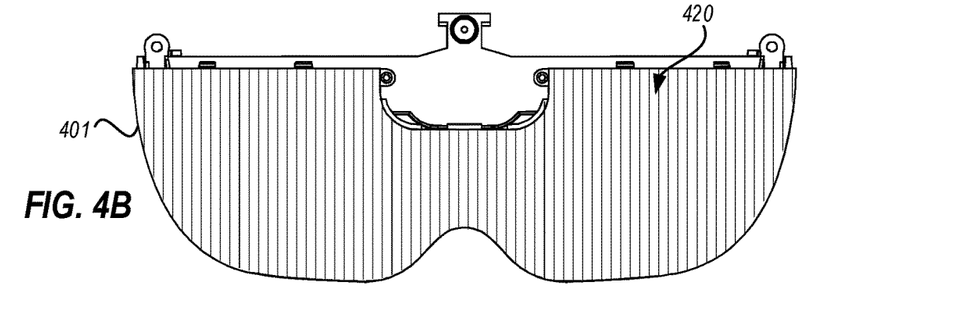
Figure 4C:
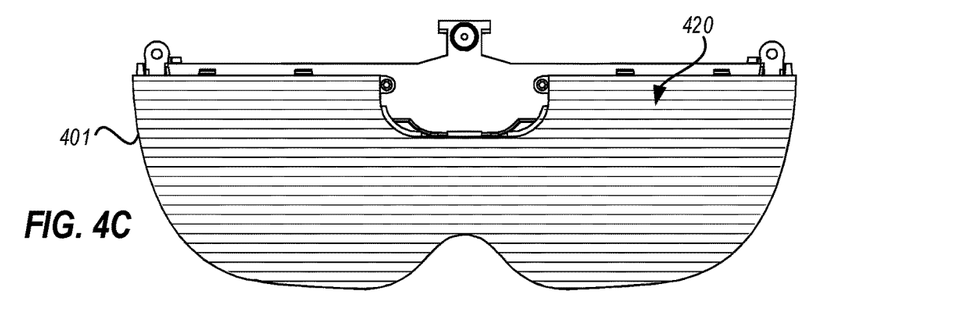
Figure 4D:
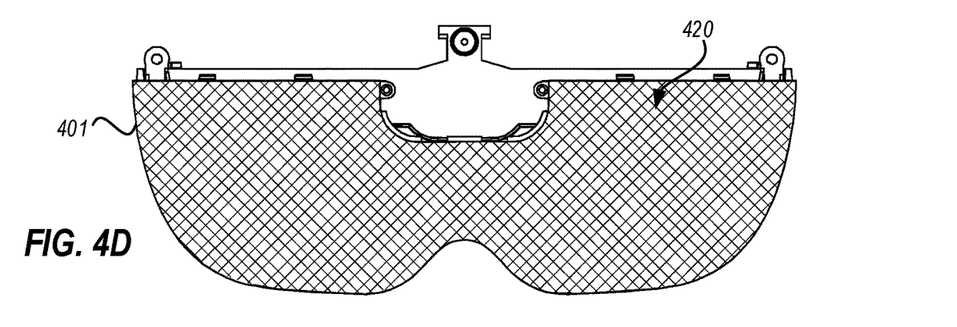
Figure 4E:
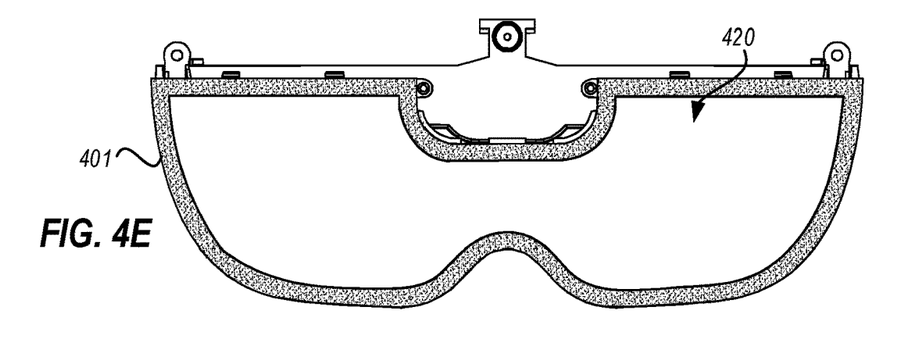
Figure 4F:
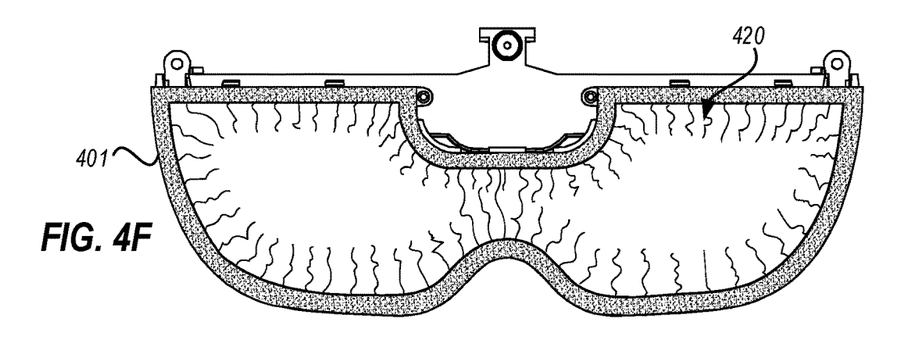
Figure 4G:
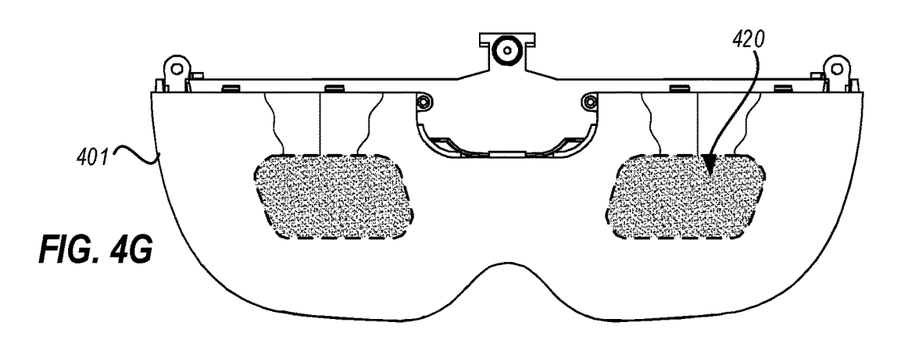
Figure 4H:
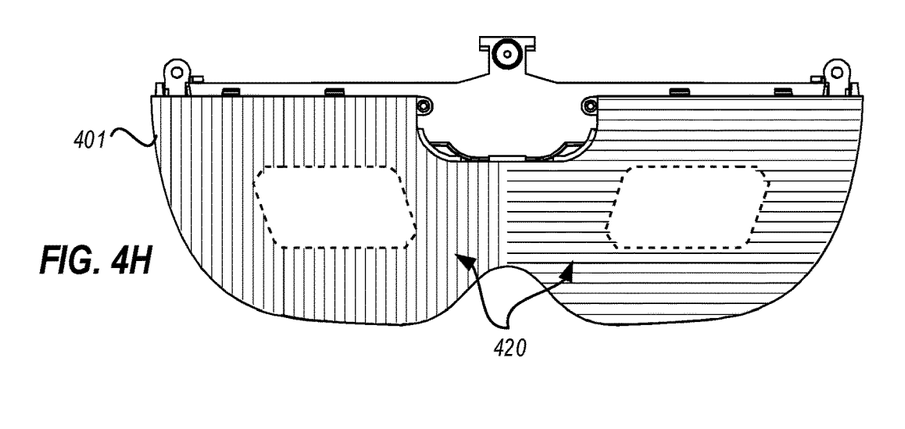

FIG. 4A shows a thermally conductive element 420 that is applied to the display element 401 as a coating, layer, or film on a surface of the display element 401. FIG. 4B shows a thermally conductive element 420 that is applied to the display element 401 as a series of linear wires disposed on the display element 401 in a vertical arrangement. FIG. 4C shows a thermally conductive element 420 that is applied to the display element 401 as a series of linear wires disposed on the display element 401 in a horizontal arrangement. FIG. 4D shows a thermally conductive element 420 that is applied to the display element 401 in a crosshatch arrangement. FIG. 4E shows a thermally conductive element 420 that is applied to the display element 401 as a coating, layer, or film around a perimeter of a surface of the display element 401. FIG. 4F shows a thermally conductive element 420 that is applied to the display element 401 as a coating, layer, or film around a perimeter of a surface of the display element 401 with additional wires extending inward on the display element 401 from the coating, layer, or film. FIG. 4G shows a thermally conductive element 420 that is applied to the display element 401 as a coating, layer, or film over eye boxes (e.g., portions of the display element 401 on which a user's eye would likely gaze; the user's field of view) of the display element 420, with thermally conductive wires extending from the coating, layer, or film over the eye-boxes to a perimeter of the display element 401. FIG. 4H shows a thermally conductive element 420 that is applied to the display element 401 but not applied over eye boxes of the display element 420. One portion of the thermally conductive element 420 is disposed on the display element 401 as a series of wires in a linear arrangement, while another portion of the thermally conductive element 420 is disposed on the display element 401 as a series of wires in a horizontal arrangement.

The thermally conductive element 420 may be composed of any thermally conductive material or combination thereof. In some instances, the thermally conductive element 420 is implemented as an optically transmissive material. Optically transmissive materials may be particularly desirable when the thermally conductive element 420 will be disposed over an eye box of a display element (e.g., as shown in FIGS. 4A-4D and 4G). Such optically transmissive materials may include, for example, indium tin oxide (ITO) and/or silver nanowire.

In some instances, the thermally conductive element 420 is implemented as an optically opaque material. Optically opaque materials may be useful when used over a portion of the display element 401 that does not include an eye box (e.g., FIGS. 4E, 4F, and 4H). Optically opaque materials may include, for example, silver, copper, aluminum nitride, silicon carbide, aluminum, tungsten, graphite, and/or zinc.

It should be noted that optically transmissive materials and opaque materials may be used in combination in some embodiments. For example, the perimeter portion of the thermally conductive element 420 of FIG. 4F may be composed of an optically opaque material, while the wires extending inward may be composed of an optically transmissive material, or the eye box portion of the thermally conductive element 420 of FIG. 4G may be composed of an optically transmissive material, while the wires extending toward the perimeter may be composed of an optically opaque material.

Embodiments have been described above for selectively disabling thermally conductive paths between heat sources and display elements (such as by switches or selectively enablable heat sources) when, for example, the temperature of the display elements reaches or exceeds a predetermined threshold associated with user comfort. Those skilled in the art will recognize, however, that other methods for preventing the temperature of a display element from reaching stifling levels are within the scope of this disclosure.

Figure 5:
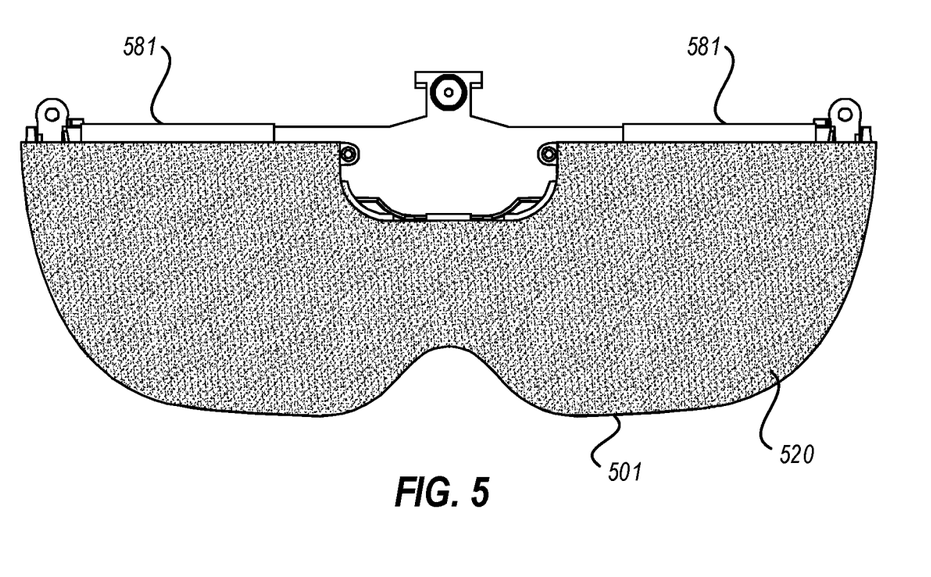
FIG. 5 shows conceptual representations of heat diffusers in thermal communication with a thermally conductive element.

For example, FIG. 5 shows a conceptual representation of heat diffusers 581 in thermal communication with a thermally conductive element 520 that is positioned proximate to a display element 501. The heat diffusers 581 of FIG. 5 are configured to disperse heat into the surrounding environment (or toward another portion of a device), such as waste heat that is transferred to the thermally conductive element 520 from one or more heat sources. For example, in some embodiments, the heat diffusers 581 are designed and positioned with respect to the thermally conductive element to disperse heat from the thermally conductive element into the environment so as to aid in preventing the temperature of the display element 501 from exceeding a predetermined temperature (e.g., 85° F.). In such embodiments, the heat diffusers 581 may comprise a portion of the thermally conductive elements for diffusing waste heat from HMD components to display elements.

In some embodiments, the head diffusers are implemented as one or more heat sinks, heat pipes, vapor chambers, or other heat spreading devices. Furthermore, it will be appreciated that any number of heat diffusers (e.g., 0, 1, 2, 3, 4) may be implemented into a system for increasing the temperature of a display element with waste heat.

The following discussion now refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

Figure 6:
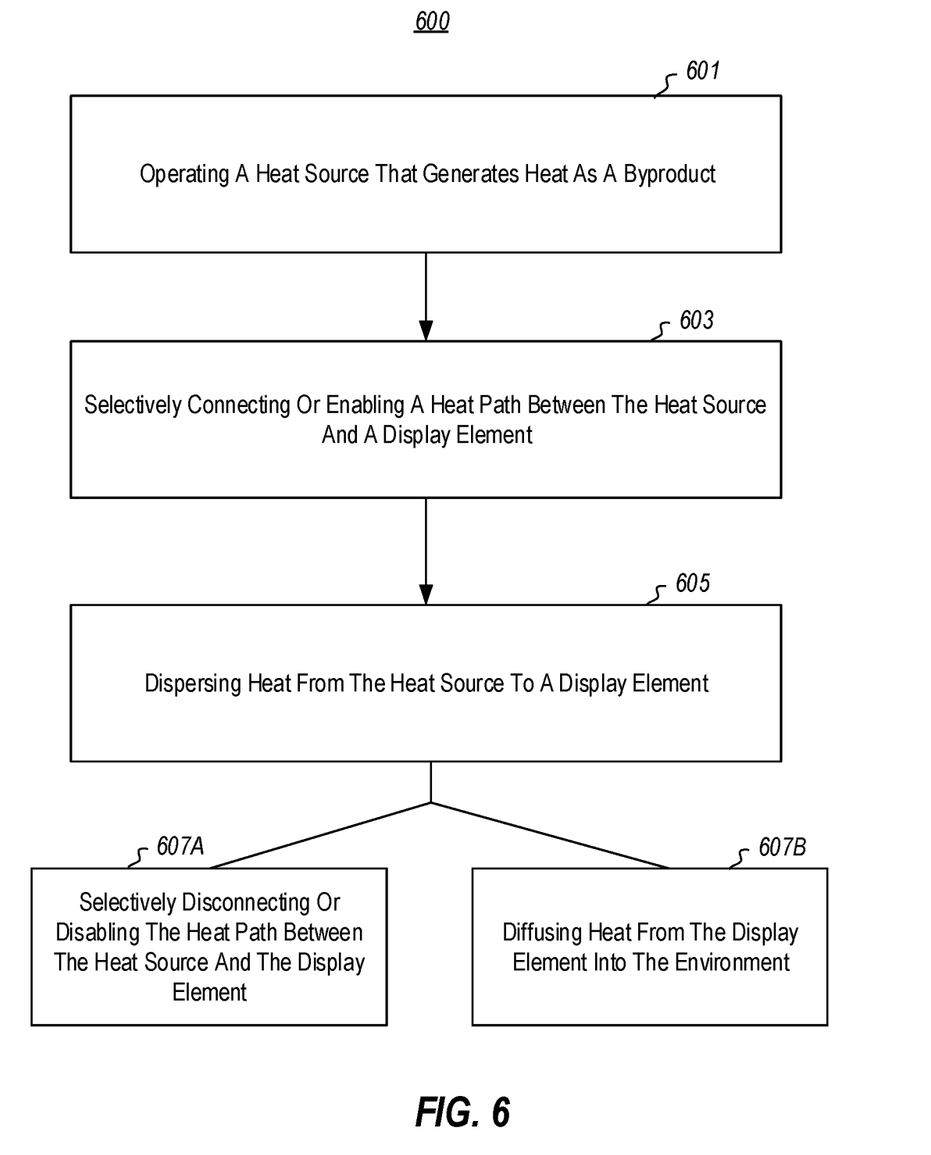
FIG. 6 shows an exemplary flow diagram depicting a method for increasing the temperature of a display element.

FIG. 6 shows an exemplary flow diagram 600 of acts associated with methods for selectively increasing the temperature of a display element. As shown, the flow diagram 600 includes an act of operating a heat source that generates heat as a byproduct (act 601), an act of selectively connecting or enabling a heat path between the heat source and a display element (act 603), an act of dispersing heat from the heat source to a display element (act 605), and an act of selectively disconnecting or disabling the heat path between the heat source and the display element (act 607A) or diffusing heat from the display element into the environment (act 607B).

As noted above, act 601 includes operating a heat source that generates heat as a byproduct. In some embodiments, the heat source is implemented as one or more computer hardware elements, such as a CPU GPU, camera, display engine (e.g., LED or other display generating component), a battery, memory or another storage device and/or one or more other elements of a wearable device such as an HMD.

The heat source performs a user experience function independent of generating heat, and therefore generates heat only as a byproduct of performing its independent function. For example, when the heat source is implemented as a display engine (e.g., one or more LEDs or laser diodes) the independent function is displaying an image generated/rendered by a GPU. Heat is generated as a byproduct of performing this function (e.g., laser diodes generate excess heat that is normally dispersed into an environment surrounding the laser diode and the GPU generates heat while processing the data to be rendered).

Act 603 includes selectively connecting or enabling a heat path between the heat source and a display element. The heat path may be formed by one or more thermally conductive elements (e.g., composed of ITO, silver nanowire, or another thermally conductive material) that are in proximity to both the heat source and the display element. This may also include selectively disconnecting or disenabling the heat path.

In some embodiments, the heat path becomes selectively connected/disconnected by actuating a switch associated with the heat path (e.g., an electromechanical switch). In some instances, the switch is activated in response to a triggering event and/or a signal generated by a logic device (e.g., a signal generated in response to detecting that a threshold temperature has been exceeded or met and/or in response to detecting user input). When the switch is activated, it selectively connects or disconnects the heat path in response to the output. In other embodiments, the heat path becomes selectively enabled/disabled by selectively enabling a heat source (e.g., a new or redundant hardware component) that is in thermal communication with the display element (e.g., by a thermally conductive element).

It should be noted that in embodiments that do not include a switch or selectively enablable heat source, act 603 may be omitted.

Act 605 includes dispersing heat from the heat source to a display element. The heat is transferred along the thermally conductive path formed by the thermally conductive element(s) (when the path is selectively connected/enabled) to the display element, where the heat is dispersed to the desired portions of the display element to increase the temperature of the display element to prevent condensation of water molecules onto the display element.

Act 607A includes selectively disconnecting or disabling the heat path between the heat source and the display element, and act 607B includes diffusing heat from the display element into the environment. Those skilled in the art will recognize that the method represented in flow diagram 600 may include either, both, or neither of these steps.

In some embodiments, the switches and/or selectively enablable heat sources described above in relation to act 603 are also operable to selectively disconnect and/or selectively disable the heat path between the heat source and the display element (e.g., by receiving output to actuate the switch to disconnect the heat path in response to determining that a temperature exceeds a threshold, or by selectively disabling a heat source in response to the same).

In some embodiments, step 607B is effectuated by a heat diffuser associated with (e.g., in thermal communication with) the thermally conductive element forming the heat path. In some instances, the heat diffuser is implemented as a heat sink, heat pipe, and/or vapor chamber.

Embodiments of the present invention may comprise or utilize a special purpose computer including computer hardware (e.g., a logic device implemented as a computer system for determining whether temperature and/or relative humidity sensor readings exceed a predetermined threshold), as discussed in greater detail below. Embodiments within the scope of the present invention also may include physical and other computer-readable media for carrying or storing computer-executable instructions and/or data structures. Such computer-readable media can be any available media that can be accessed by a general purpose or special purpose computer system. Computer-readable media that store computer-executable instructions are physical storage media. Computer-readable media that carry computer-executable instructions are transmission media. Thus, by way of example, and not limitation, embodiments of the invention can comprise at least two distinctly different kinds of computer-readable media: physical computer-readable storage media and transmission computer-readable media.

Physical computer-readable storage media includes RAM, ROM, EEPROM, CD-ROM or other optical disk storage (such as CDs, DVDs, etc.), magnetic disk storage or other magnetic storage devices, or any other medium which can be used to store desired program code means in the form of computer-executable instructions or data structures and which can be accessed by a general purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry or transmit desired program code means in the form of computer-executable instructions or data structures and which can be accessed by a general purpose or special purpose computer. Combinations of the above are also included within the scope of computer-readable media.

Further, upon reaching various computer system components, program code means in the form of computer-executable instructions or data structures can be transferred automatically from transmission computer-readable media to physical computer-readable storage media (or vice versa). For example, computer-executable instructions or data structures received over a network or data link can be buffered in RAM within a network interface module (e.g., a "NIC"), and then eventually transferred to computer system RAM and/or to less volatile computer-readable physical storage media at a computer system. Thus, computer-readable physical storage media can be included in computer system components that also (or even primarily) utilize transmission media.

Computer-executable instructions comprise, for example, instructions and data which cause the disclosed computing system (e.g., special purpose computer/HMD) to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Alternatively, or in addition, the functionality described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A system for increasing a temperature of a display element, the system comprising:

the display element comprising one or more optics configured to display virtual content;
a heat source configured to generate heat as a byproduct of performing a user experience function independent of generating heat; and
a thermally conductive element coupled to and in thermal communication with the heat source and positioned proximate to the display element forming a thermally conductive path between the heat source and the display element, the thermally conductive path being configured to redirect the heat generated by the heat source as the byproduct of performing the user experience function independent of generating heat toward the one or more optics of the display element.

2. The system of claim 1, wherein the display element is mounted on a head-mounted display (HMD).

3. The system of claim 1, wherein the display element is optically transmissive.

4. The system of claim 1, wherein the display element completely obscures view of a real-world environment when worn by a user.

5. The system of claim 1, wherein the heat source is a central processing unit.

6. The system of claim 1, wherein the heat source is a graphics processing unit.

7. The system of claim 1, wherein the heat source is a light source.

8. The system of claim 1, wherein the heat source is a display engine associated with rendering or generating an image for display on the display element.

9. The system of claim 1, wherein the thermally conductive element is an optically transmissive material.

10. The system of claim 9, wherein the thermally conductive element is an indium tin oxide (ITO) coating.

11. The system of claim 9, wherein the thermally conductive element is a silver nanowire formation.

12. The system of claim 1, further comprising:
a switch that selectively connects and disconnects the thermally conductive path between the heat source and the display element in response to detecting a triggering event.

13. The system of claim 12, wherein the switch is an electromechanical switch.

14. The system of claim 12, wherein the triggering event comprises detecting user input for selectively connecting or disconnecting the thermally conductive path.

15. The system of claim 12, wherein the triggering event comprises detecting a temperature or a relative humidity sensor reading associated with the display element that meets or exceeds a predetermined sensor threshold.

16. The system of claim 1, further comprising:
one or more sensors for detecting one or more temperatures or a relative humidity associated with the display element or an ambient environment where the system is located.

17. The system of claim 1, further comprising:
at least two redundant heat sources having a same functionality and being configured to be selectively enabled or disabled in response to a triggering event.

18. The system of claim 1, further comprising:
a heat diffuser in thermal communication with the thermally conductive element.

19. A system for increasing a temperature of a display element, the system comprising:
the display element comprising one or more optics configured to display virtual content;
a heat source configured to generate heat as a byproduct of performing a user experience function independent of generating heat; and
a thermally conductive element coupled to and in thermal communication with the heat source and in direct physical contact with the display element, the thermally conductive element forming a thermally conductive path between the heat source and the display element, the thermally conductive path being configured to redirect heat generated by the heat source as the byproduct of performing the user experience function independent of generating heat toward the one or more optics of the display element.

20. A method for increasing a temperature of a display element, the method comprising:
generating heat as a byproduct of operating a heat source to perform a user experience function independent of generating heat; and
redirecting the heat generated by the heat source as the byproduct of operating the heat source to perform a user experience function independent of generating heat toward one or more optics of the display element configured to display virtual content via a thermally conductive path formed by a thermally conductive element coupled to and in thermal communication with the heat source and positioned proximate to the display element.

* * * * *